(12) United States Patent
Nakajima (10) Patent No.: US 6,653,644 B1
(45) Date of Patent: Nov. 25, 2003

(54) PATTERN EXPOSURE METHOD AND APPARATUS

(75) Inventor: Ken Nakajima, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 98 days.

(21) Appl. No.: 09/602,460

(22) Filed: Jun. 23, 2000

(30) Foreign Application Priority Data

Jun. 23, 1999 (JP) .......................................... 11-177096

(51) Int. Cl.[7] .......................... H01J 37/302; H01J 1/02; H01J 29/04
(52) U.S. Cl. ........................ 250/492.22; 250/492.1; 250/492.2; 250/492.21; 430/5; 430/30; 430/322; 430/396; 378/34; 378/35
(58) Field of Search .......................... 250/492.1, 492.2, 250/492.22, 492.21, 492.3, 493.1, 398; 430/5, 30, 322, 396; 378/34, 35

(56) References Cited

U.S. PATENT DOCUMENTS 5,260,151 A * 11/1993 Berger et al. .................. 430/5
5,438,204 A * 8/1995 von Bunau et al. ....... 250/492.2
6,333,508 B1 * 12/2001 Katsap et al. ............ 250/492.2

FOREIGN PATENT DOCUMENTS

| JP | 5-251317 | 9/1993 |
| JP | 8-250414 | 9/1996 |
| JP | 11-121329 | 4/1999 |

* cited by examiner

Primary Examiner—John R. Lee
Assistant Examiner—David A. Vanore
(74) Attorney, Agent, or Firm—Scully, Scott, Murphy & Presser (57) ABSTRACT

In a pattern exposure method and apparatus for projecting a circuit pattern on a circuit member by an electron beam passing through a pattern exposure mask having a number of exposure regions separated from one another by a boundary region, the pattern exposure mask additionally includes a beam restraining area for restraining the electron beam scattered by the boundary region, so that the strength of the total background exposure is equalized.

12 Claims, 10 Drawing Sheets

Fig. 5 acceleraction voltage : 100kV

Ref: Jpn. Appl. Phys. Vol.34 (1995) pp.6675-6678

PATTERN EXPOSURE METHOD AND APPARATUS

BACKGROUND OF THE INVENTION

The present invention relates to a pattern exposure method and apparatus for projecting a circuit pattern on a circuit member by a charged particle beam passing through a pattern exposure mask, and a method and system for fabricating a semiconductor integrated circuit by utilizing the pattern exposure method and apparatus. The present invention also relates to a pattern exposure mask used for exposure of a circuit pattern of the integrated circuit, a method for forming the pattern exposure mask, and an integrated circuit having a layer/film patterned by the exposure.

Recently, an integrated circuit such as an LSI (large scale integrated circuit) is widely utilized in various fields, and therefore, an increased integration density and an elevated productivity are strongly demanded. At present, a means for forming a circuit pattern in the integrated circuit includes an optical printing and a direct drawing using an electron beam. The resolution of the optical printing is not so high as that of the electron beam drawing, but the productivity of the electron beam drawing is not so high as that of the optical printing.

In general, in the optical printing, a circuit pattern is projected by a transmission light passing through a pattern exposure mask. In the electron beam drawing, on the other hand, an electron beam is magnetically deflected and scanned to directly draw the circuit pattern. At the present, however, there is a technology for causing the electron beam to pass through the pattern exposure mask to project the circuit pattern.

However, in the optical printing using the pattern exposure mask, the circuit pattern is projected by only the transmission light. However, in the electron beam projection using the pattern exposure mask, not only the circuit pattern is projected by a transmission electron beam, but also a background exposure is caused because of a scattering beam.

In this case, since the exposure strength of the circuit pattern by the transmission electron beam is intensified by the background exposure caused by the scattering beam, the radiation strength of the electron beam can be reduced.

Now, one prior art example of the above mentioned pattern printing system will be described with reference to FIGS. 9 to 12B.

Figure 9:
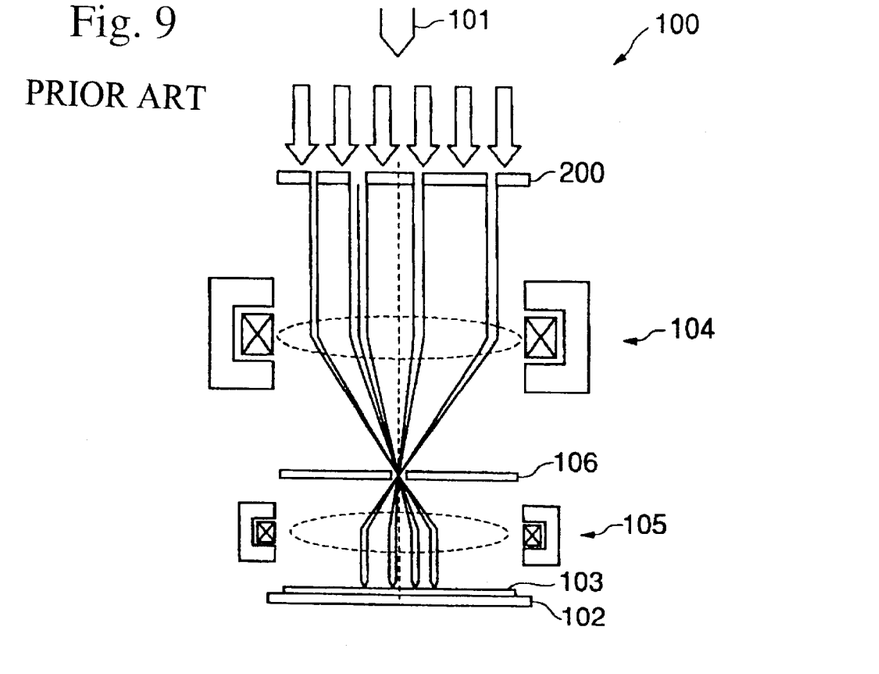
FIG. 9 is a diagrammatic view of an essential part of an electron beam projection apparatus.
Figure 10A:
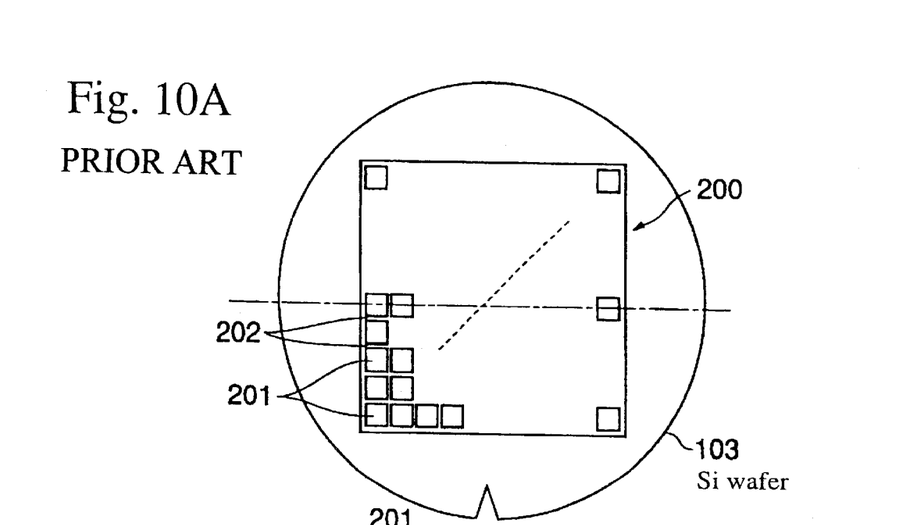
FIGS. 10A and 10B are a diagrammatic plan view and a diagrammatic sectional view showing a structure of a prior art pattern exposure mask.
Figure 10B:
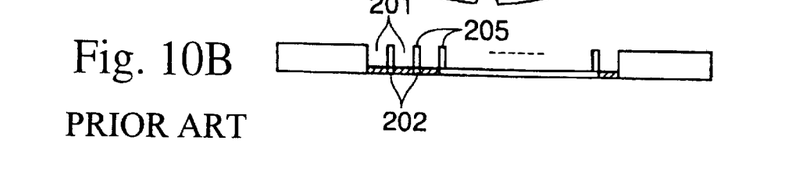
Figure 11A:
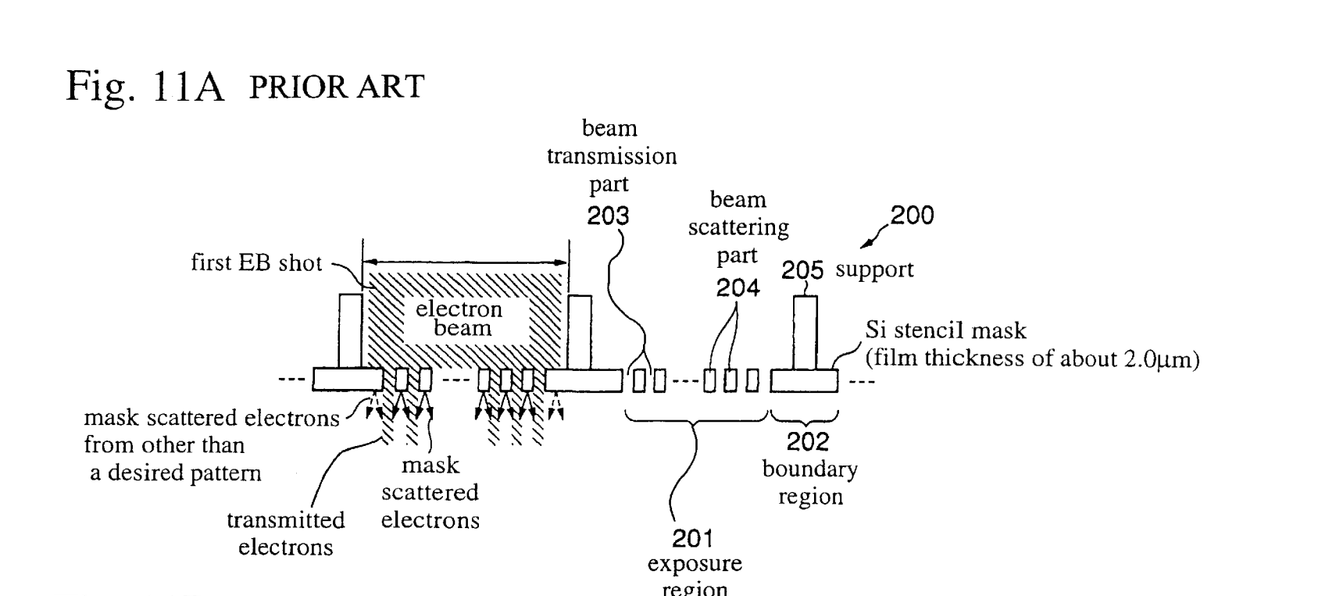
FIGS. 11A and 12A are diagrammatic views schematically showing the relation between the pattern exposure mask and the electron beam that is a charge particle beam, for illustrating the prior art pattern exposure method.
Figure 11B:
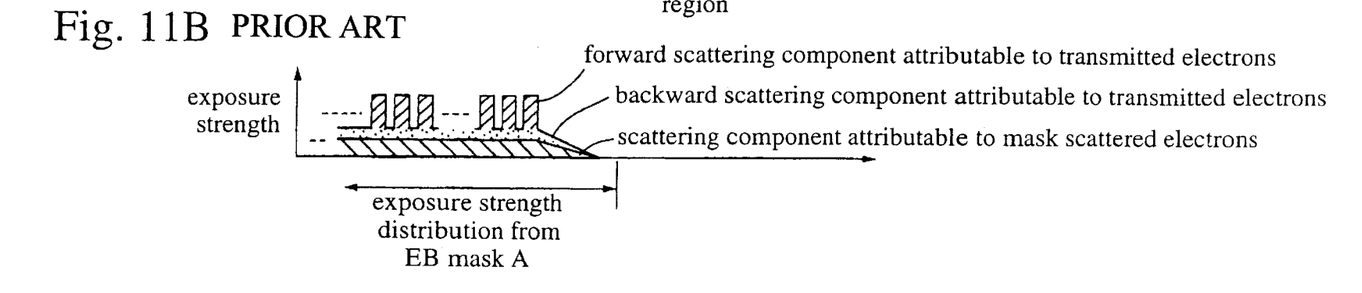
FIGS. 11B and 12B are diagrams showing the exposure strength on the circuit member, for illustrating the prior art pattern exposure method.
Figure 12A:
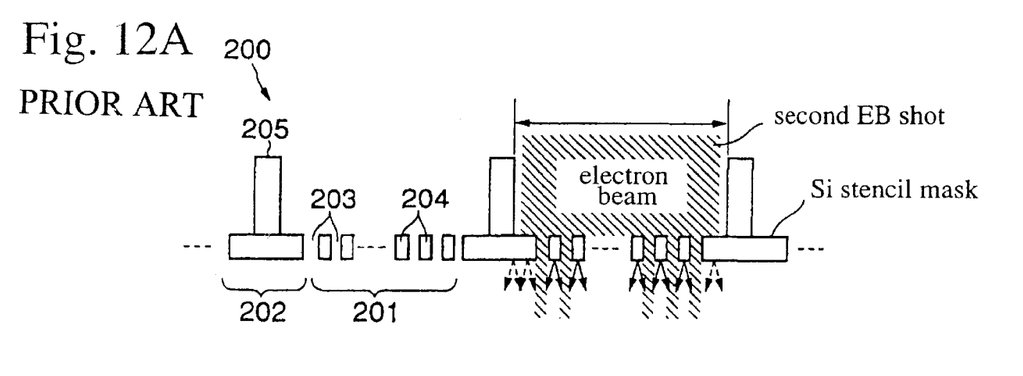
Figure 12B:
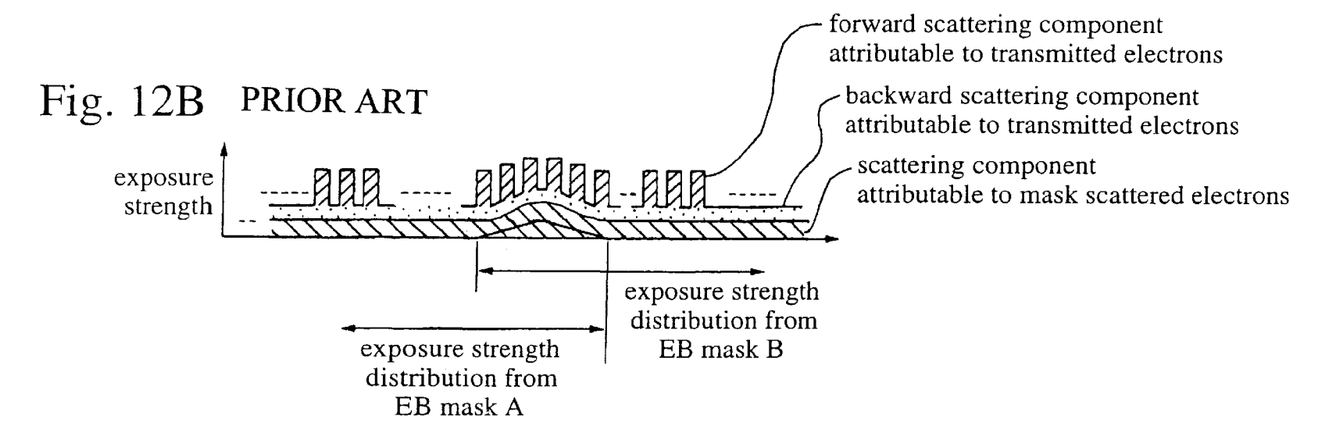

FIG. 9 is a diagrammatic view of an essential part of an electron beam projection apparatus. FIG. 10A is a diagrammatic plan view showing a structure of a pattern exposure mask, and FIG. 10B is a diagrammatic sectional view of the pattern exposure mask. FIGS. 11A, 11B, 12A and 12B illustrate the order of the pattern printing method. FIGS. 11A and 12A are diagrammatic views schematically showing the relation between the pattern exposure mask and the electron beam that is a charge particle beam. FIGS. 11B and 12B are diagrams showing the exposure strength on the circuit member.

The shown electron beam projection apparatus, generally designated with the reference number 100, has a pattern exposure mask 200 which is a replaceable parts. The pattern exposure mask 200 has a plurality of exposure regions 201. Specifically, as shown in FIG. 10A, the pattern exposure mask 200 is formed in the form of a square plate, and a number of square exposure regions 201 are arranged in the form of matrix having a number of rows and a number of columns. The square exposure regions 201 are separated from one another by a boundary region 202.

Furthermore, since the pattern exposure mask 200 is so configured to project the circuit pattern of one circuit member by one pattern exposure mask, the circuit pattern of the one circuit member is divided into a plurality of circuit sub-patterns, and the plurality of square exposure regions 201 in the one pattern exposure mask 200 correspond to the plurality of circuit sub-patterns, respectively. Therefore, each of the plurality of square exposure regions 201 in the one pattern exposure mask 200 includes a plurality of beam transmission parts 203 and a plurality of beam scattering parts 204. As shown in FIG. 11A, the beam transmission parts 203 are formed of through-holes formed in the pattern exposure mask 200 formed of silicon, and therefore, correspond to a shape of a portion to be exposed. The beam scattering parts 204 and the boundary region 202 are the remaining parts of the pattern exposure mask 200 excluding the beam transmission parts 203, and therefore, correspond to a shape of a portion that should not be exposed.

The pattern exposure mask 200 is formed of an SOI (silicon on insulator) substrate which is a multi-layer substrate, and therefore, one layer remains on the boundary region 202 as a reinforcing support 205. The pattern exposure mask 200 having the above mentioned structure is removably fitted on a predetermined place in the electron beam projection apparatus 100.

This electron beam projection apparatus 100 includes an electron gun 101 as a beam irradiator for irradiating the electron beam (as the charged particle beam) onto the pattern exposure mask 200. At an opposite side of the pattern exposure mask 200, a holder stage 102 is provided as a member holding means for holding a silicon wafer 103 which is a circuit member to be exposed.

In the way of the path passing from the electron gun 101 through the pattern exposure mask 200 to the silicon wafer 103, various electron optical systems 104 and 1054 and an aperture 106 are located so as to adjust the focusing and the reduction of an image of the electron beam projected onto the silicon wafer 103.

In the electron beam projection apparatus 100, furthermore, an irradiating and scanning means. (not shown) is constituted of a displacement mechanism (not shown) for vertically and horizontally displacing the electron gun 101, and a scanning mechanism (not shown) for vertically and horizontally deflecting the electron beam irradiated from the electron gun 101 onto the pattern exposure mask 200. By action of this irradiating and scanning means, the electron beam from the electron gun 101 is irradiated for each of the exposure regions 201 in the pattern exposure mask 200, region by region in order.

Similarly, an irradiation adjusting means (not shown) is constituted of a displacement mechanism (not shown) for vertically and horizontally displacing the holder stage 102 holding the silicon wafer 103, and a scanning mechanism (not shown) for vertically and horizontally deflecting the electron beam from passing through the pattern exposure mask 200 to be irradiated onto the silicon wafer 103. By action of this irradiation adjusting means, a corresponding number of irradiation regions of the electron beam passing through the plurality of exposure regions 201 in the pattern exposure mask 200 is located closely to one another in order on a surface of the silicon wafer 103 held on the holder stage 102, with no unexposed region corresponding to the boundary region 202 being interposed between the irradiation regions.

Thus, the electron beam projection apparatus 100 having the above mentioned features, a resist film formed on the silicon wafer 103 is exposed by the electron beam in accordance with the circuit pattern of the pattern exposure mask 200. In this case, the electron beam from the electron gun 101 is irradiated onto each of the plurality of exposure regions 210 in the pattern exposure mask 200, one by one, in the order, by action of the irradiation scan means.

Simultaneously, the irradiation regions of the electron beam having passed through the respective exposure regions 201 in the pattern exposure mask 200 are located closely to one another on the surface of the silicon wafer held on the holder stage 102, with no unexposed region corresponding to the boundary region 202, by action of the irradiation adjusting means.

Accordingly, as shown in FIGS. 11A, 11B, 12A and 12B, the exposure regions 201 are located in the pattern exposure mask 200 with the boundary region 202 being between each pair of adjacent exposure regions. On the surface of the silicon wafer 103, however, the irradiation regions of the electron beam passing through the respective exposure regions 201 in the pattern exposure mask 200 are located adjacent to one another with no unexposed region corresponding to the boundary region 202. The circuit pattern which is divided into the plurality of exposure regions 201 separated from one another by the boundary region 202 in the pattern exposure mask 200, becomes one continuous pattern again on the surface of the silicon wafer 103.

In this process, the circuit pattern is projected onto the silicon wafer 103 by the electron beam passing through the beam transmission part 203 within the exposure region 201 of the pattern exposure mask 200. Simultaneously, the background exposure occurs because of the electron beams scattered by the beam scattering part 204 and the boundary region 202. As a result, the exposure strength of the circuit pattern by the transmission beam is intensified by the background exposure attributable to the scattering beam.

Here, in the example mentioned above, a number of square exposure regions 201 are arranged vertically and horizontally in the pattern exposure mask 200 of the square plate. The beam transmission part 203 is formed of a through-hole corresponding to a shape to be exposed, and the beam scattering part 204 and the boundary region 202 are formed of the remaining part corresponding to an area which should not be exposed.

Figure 13A:
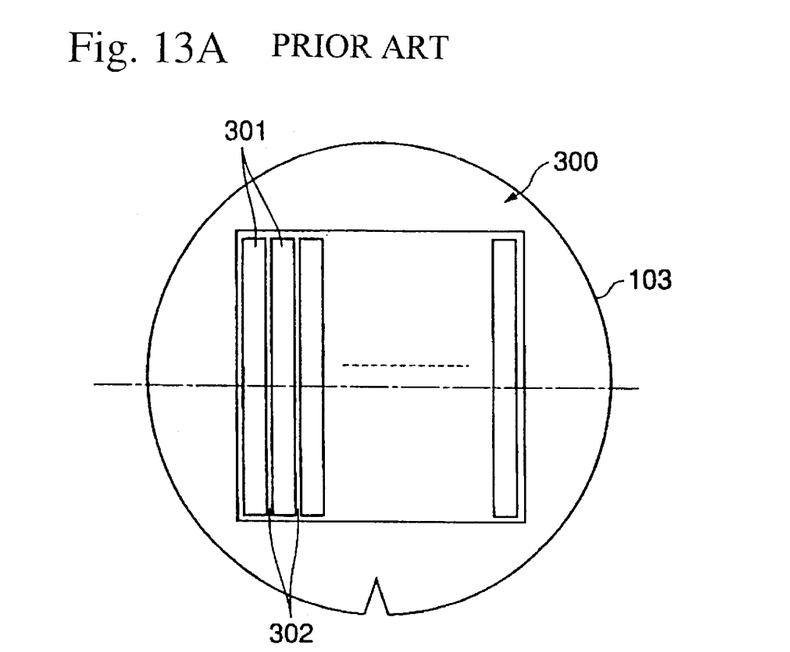
FIGS. 13A, 13B and 13C are a diagrammatic plan view, a diagrammatic sectional view and a diagrammatic enlarged partial sectional view showing a structure of another example of the prior art pattern exposure mask.
Figure 13B:
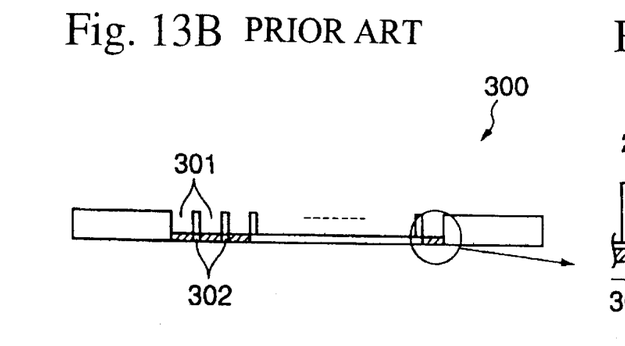
Figure 13C:
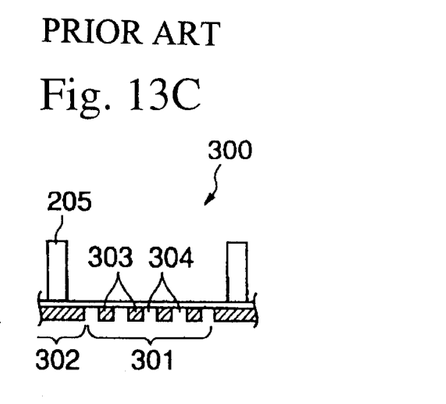

However, a pattern exposure mask 300 as shown in FIGS. 13A, 13B and 13C is known, which includes a number of elongated exposure regions 301 in the form of a stripe extending vertically. The elongated exposure regions 301 are arranged in a horizontal direction and separated from one another by an elongated boundary region 302. In this type of pattern exposure mask 300, it is a general practice that the boundary region 302 and a beam scattering part 303 are formed of a heavy metal layer laminated on a lower surface, and a beam transmission part 304 is constituted of a part from which the heavy metal layer is removed.

In this type of pattern exposure mask 300, since the beam transmission part 304 is not a through-hole, the beam transmission part 304 can be formed for example in a toroidal shape. In addition, since an overall mechanical strength is excellent, it is possible to make the exposure region 301 in the strip shape so as to elevate the productivity of the mask formation and the exposure.

In this type of pattern exposure mask 300, on the other hand, since a thin silicon plate remains in the beam transmission part 304, the electron beam passing through the beam transmission part 304 is scattered to some degree, with the result that the exposure resolution lowers. The above mentioned pattern exposure masks 200 and 300 have the advantage and the disadvantage, respectively, and therefore, an optimum one should be selected in accordance with various conditions.

As mentioned above, in the pattern exposure method using the pattern exposure apparatus mentioned above, the circuit pattern divided into the plurality of exposure regions 201 in the pattern exposure mask 200 can be projected as one continuous image on the silicon wafer 103.

However, the plurality of exposure regions 201 separated from one another by the boundary region 202 are projected in order on the surface of the silicon wafer 103 in such a manner that the projected image of the plurality of exposure regions 201 are located adjacent to one another on the surface of the silicon wafer 103. In this process, the electron beam scattered by the intervening boundary region 202 is repeatedly irradiated on the same position in a first electron beam shot for one exposure region 201 (as shown in FIGS. 11A and 11B) and a succeeding second electron beam shot for an adjacent exposure region 201 (as shown in FIGS. 12A and 12B).

In this case, as shown in FIG. 12B, the strength of the background exposure becomes excessive at the position to which the scattering beam is repeatedly irradiated. In this case, the line width of the circuit pattern projected by the transmission beam passing through the beam transmission part 203 becomes large, with the result that the circuit pattern is short-circuited in the worst case. This problem occurs not only in the pattern exposure mask 200 but also in the pattern exposure mask 300, and becomes more serious if the resolution of the circuit pattern to be exposed is elevated.

BRIEF SUMMARY OF THE INVENTION

Accordingly, it is an object of the present invention to provide a pattern exposure method and apparatus for projecting a circuit pattern on a circuit member by a charged particle beam passing through a pattern exposure mask, which have overcome the above mentioned problems of the prior art.

Another object of the present invention is to provide a pattern exposure method and apparatus capable of substantially equalizing the background exposure.

Still another object of the present invention is to provide a method and system for fabricating a semiconductor integrated circuit by utilizing the pattern exposure method and apparatus.

A further object of the present invention is to provide a pattern exposure mask capable of substantially equalizing the background exposure, a method for forming the pattern exposure mask, and an integrated circuit having a layer/film patterned by the exposure substantially equalizing the background exposure.

According to a first aspect of the present invention, there is provided a pattern exposure method using a pattern exposure system which comprises a pattern exposure mask including a plurality of exposure regions which are separated from one another by a boundary region and which correspond to a plurality of circuit sub-patterns obtained by dividing one circuit pattern, each of the exposure regions including a plurality of beam transmission parts and a plurality of beam scattering parts, and a beam irradiating means for irradiating a charged particle beam to the pattern exposure mask, the method including the step of irradiating the charged particle beam from the beam irradiating means to each of the plurality of exposure regions in the pattern exposure mask in the order, so as to cause the transmitted charged particle beam passing through the beam transmission parts of the exposure region in the pattern exposure mask, to a circuit member to be exposed, so that irradiation areas of the charged particle beam passing through the respective exposure regions in the pattern exposure mask, are arranged adjacent to one another on a surface of the circuit member with no intervening portion corresponding to the boundary region, while permitting a background exposure attributable to the charged particle beam scattered by the beam scattering parts and the boundary region, wherein the charged particle beam scattered by the boundary region in the pattern exposure mask is restrained to a predetermined range.

According to a second aspect of the present invention, there is provided a pattern exposure system comprising a pattern exposure mask including a plurality of exposure regions which are separated from one another by a boundary region and which correspond to a plurality of circuit sub-patterns obtained by dividing one circuit pattern, each of the exposure regions including a plurality of beam transmission parts and a plurality of beam scattering parts, and a beam irradiating means for irradiating a charged particle beam to the pattern exposure mask, the pattern exposure system being so configured to irradiate the charged particle beam from the beam irradiating means to each of the plurality of exposure regions in the pattern exposure mask in the order, so as to cause the transmitted charged particle beam passing through the beam transmission parts of the exposure region in the pattern exposure mask, to a circuit member to be exposed, so that irradiation areas of the charged particle beam passing through the respective exposure regions in the pattern exposure mask, are arranged adjacent to one another on a surface of the circuit member with no intervening portion corresponding to the boundary region, while permitting a background exposure attributable to a charged particle beam scattered by the beam scattering parts and the boundary region, the pattern exposure system also comprising the charged particle beam restraining means for restraining the charged particle beam scattered by the boundary region in the pattern exposure mask, to a predetermined range.

According to a third aspect of the present invention, there is provided a pattern exposure mask including a plurality of exposure regions which are separated from one another by a boundary region and which correspond to a plurality of circuit sub-patterns obtained by dividing one circuit pattern, each of the exposure regions including a plurality of beam transmission parts and a plurality of beam scattering parts, the pattern exposure mask including a charged particle beam restraining means for restraining the charged particle beam scattered by the boundary region in the pattern exposure mask, to a predetermined range.

Preferably, the charged particle beam restraining means is provided on the pattern exposure mask so that when the charged particle beam is irradiated in the order to a pair of adjacent exposure regions in the pattern exposure mask, the exposure strength of a portion on the circuit member which is repeatedly exposed by the background exposure contributable to the charged particle beam scattered by the intervening boundary region between the pair of adjacent exposure regions irradiated in the order, becomes the same as the exposure strength of one background exposure contributable to the charged particle beam scattered by the beam scattering part.

In one embodiment, the charged particle beam restraining means is constituted of a film formed on at least one of an upper surface and a lower surface of the boundary region in the pattern exposure mask. For example, the film is formed of a heavy metal.

In another embodiment, the charged particle beam restraining means is constituted of a support remaining on the boundary region in the pattern exposure mask.

The above and other objects, features and advantages of the present invention will be apparent from the following description of preferred embodiments of the invention with reference to the accompanying drawings.

DETAILED DESCRIPTION OF THE INVENTION

Now, embodiments of the present invention will be described with reference to the drawings. However, in the drawings, elements corresponding to those shown in FIGS. 9 to 13C are given the same reference numbers, and explanation will be omitted for simplification of the description. In addition, a vertical direction and a horizontal direction will be expedientially explained by considering FIGS. 1A and 1B as the reference, and the vertical direction and the horizontal direction explained in this specification do not mean the directions in actual machine and apparatus.

Figure 1A:
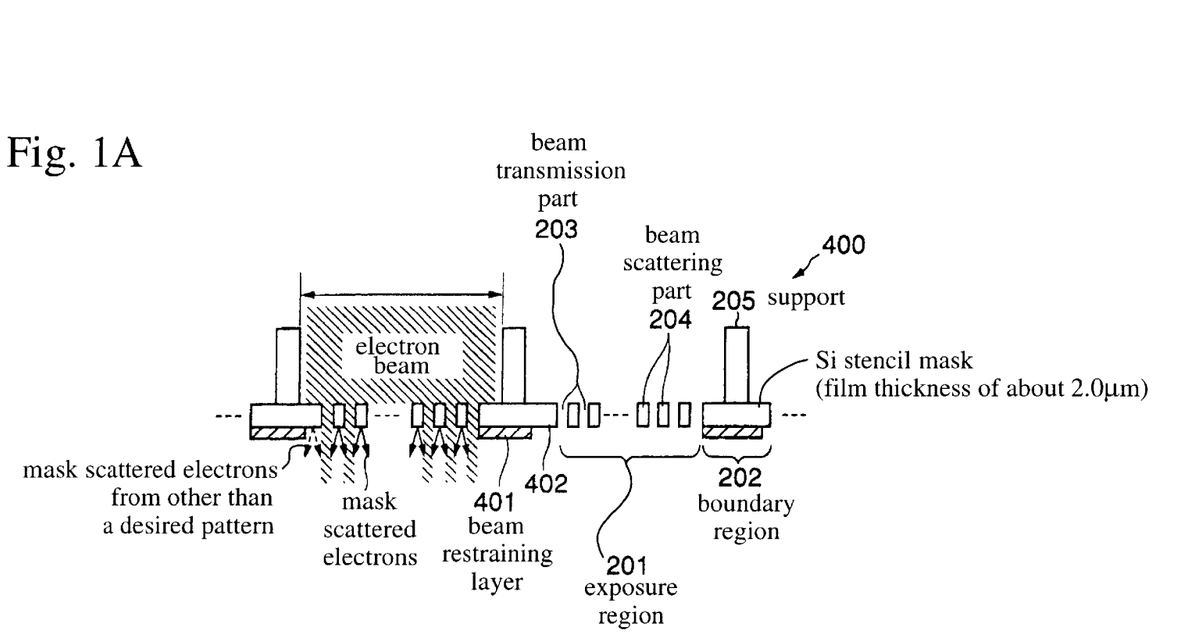
FIG. 1A is a diagrammatic view schematically showing the relation between the pattern exposure mask and the electron beam, for illustrating a first step in the pattern exposure method in accordance with the present invention.
Figure 1B:
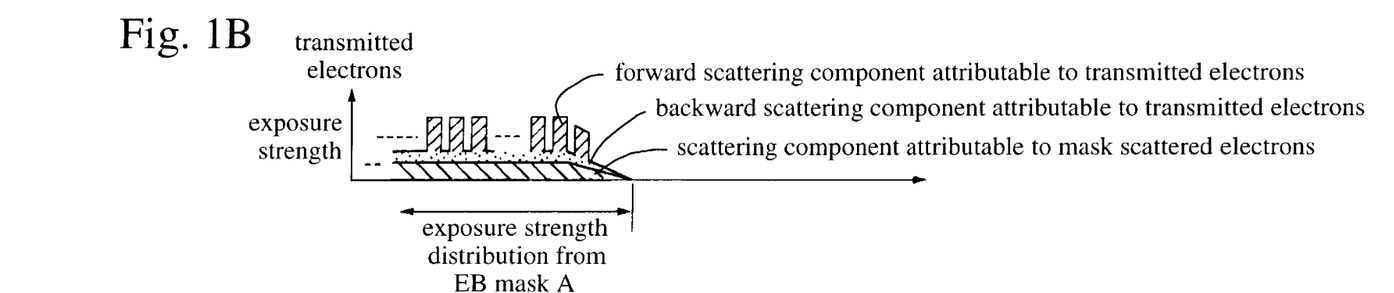
FIG. 1B is a diagram showing the exposure strength on the circuit member, also for illustrating the first step in the pattern exposure method in accordance with the present invention.
Figure 2A:
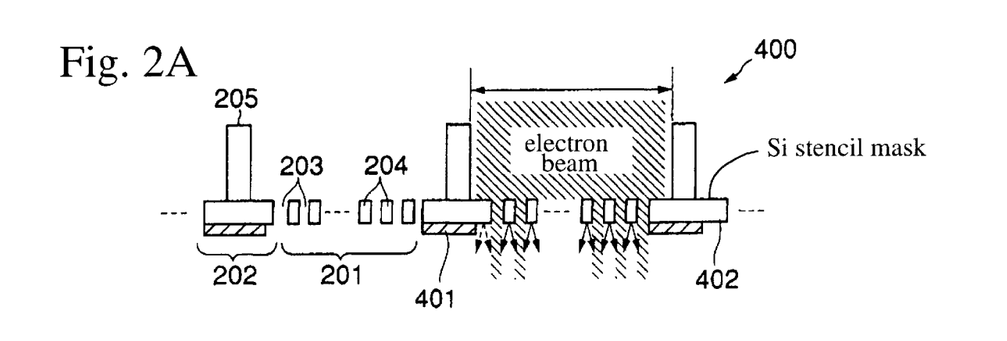
FIG. 2A is a diagrammatic view schematically showing the relation between the pattern exposure mask and the electron beam, for illustrating a second step in the pattern exposure method in accordance with the present invention.

The electron beam projection apparatus in accordance with the present invention has a structure similar to that of the electron beam projection apparatus mentioned hereinbefore, and only the structure of a pattern exposure mask, generally designated with the reference number 400 in FIGS. 1A and 2A, is different from the prior art pattern exposure mask 200 mentioned hereinbefore.

Figure 3:
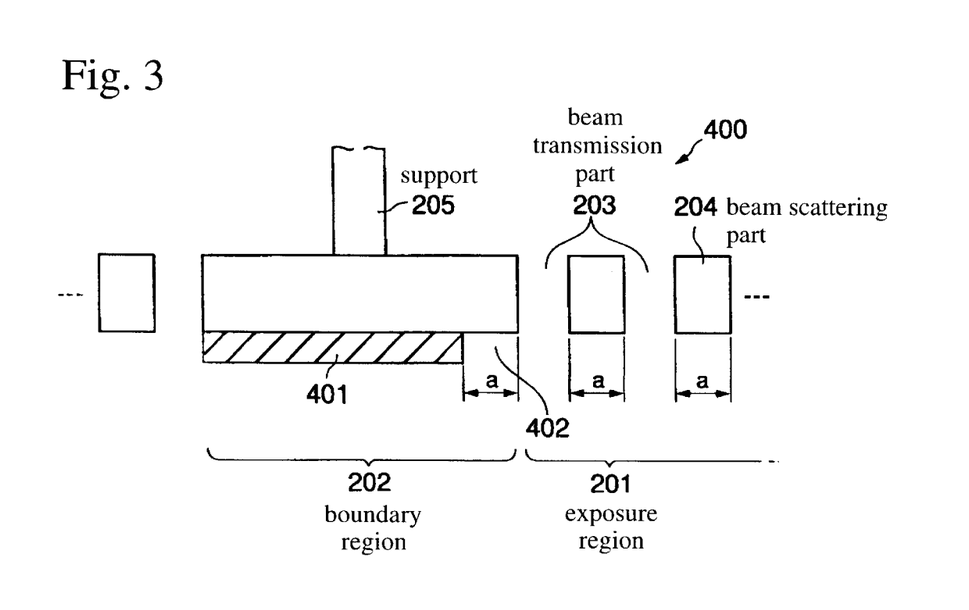
FIG. 3 is a diagrammatic partial sectional view showing an essential part of the pattern exposure mask in accordance with the present invention.

As seen from FIGS. 1A, 2A and 3, and similarly to the prior art pattern exposure mask 200, the pattern exposure mask 400 in accordance with the present invention is formed in the form of a square plate, and has a number of square exposure regions 201 are arranged in the form of matrix having a number of rows and a number of columns. The square exposure regions 201 are separated from one another by a boundary region 202. Each of the square exposure regions 201 corresponds to one of a plurality of circuit sub-patterns obtained by dividing one complete circuit pattern for one circuit member. Each of the plurality of square exposure regions 201 includes a plurality of beam transmission parts 203 and a plurality of beam scattering parts 204. The beam transmission parts 203 are formed of through-holes formed in the pattern exposure mask 400 formed of silicon, and the beam scattering parts 204 and the boundary region 202 are the remaining parts of the pattern exposure mask 400 excluding the beam transmission parts 203.

However, the pattern exposure mask 400 in accordance with the present invention has a beam restraining layer 401 formed at the boundary region 202, for restraining the electron beam (which is a charged particle beam) scattered by the boundary region 202 to a predetermined range.

Specifically, the beam restraining layer 401 is constituted of a film having a predetermined film thickness formed on a lower surface of the boundary region 202. This film is formed of heavy metal such as W, Ta, Mo, Ti, Co, TiN, WSi, Pt, Au, Ag, etc. which can advantageously block the electron beam.

However, as well shown in FIG. 3, the beam restraining layer 401 does not extend over the whole of the boundary region 202. In only one of opposite sides of the boundary region 202 facing to adjacent exposure regions 201, respectively, the beam restraining layer 401 retracts from the edge of the boundary region 202 by a predetermined distance 402, which is preferably the same as the width "a" of the gaps in the circuit pattern arranged at a minimum pitch, namely, the minimum width of the beam scattering part 204.

Figure 2B:
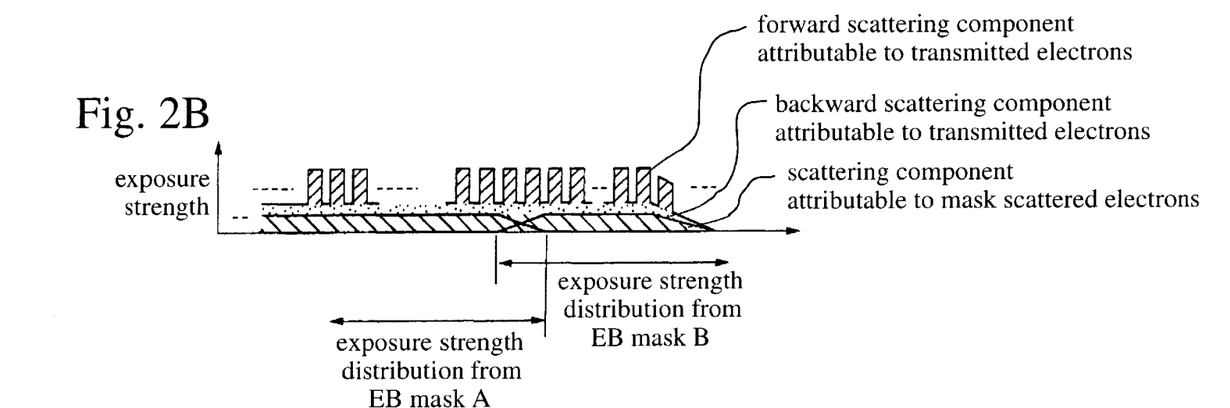
FIG. 2B is a diagram showing the exposure strength on the circuit member, also for illustrating the second step in the pattern exposure method in accordance with the present invention.

Therefore, when the electron beam is irradiated in the order to a pair of adjacent exposure regions 201 in the pattern exposure mask 400, as shown in FIGS. 1A and 2A, the total exposure strength of a portion which is repeatedly exposed by the background exposure contributable to the electron beam scattered by the intervening boundary region 202 between the pair of adjacent exposure regions 201 irradiated in the order, becomes the same as the exposure strength of one background exposure contributable to the electron beam scattered by the beam scattering part 204, as shown in FIG. 2B.

Incidentally, the electron beam projection apparatus in accordance with the present invention is provided as a part of an actual semiconductor device fabricating system (not shown). Ordinarily, in a semiconductor device fabricating method performed in the actual semiconductor device fabricating system, an integrated circuit is fabricated by repeating a process in which a resist film is deposited on the silicon wafer 103 and then is patterned by an exposure using the electron beam projection apparatus in accordance with the present invention, so as to form a pattern resist film.

Thus, in the electron beam projection apparatus in accordance with the present invention, similarly to the prior art electron beam projection apparatus 100, the circuit pattern of the pattern exposure mask 400 can be projected onto the resist film deposited on the surface of the silicon wafer 103 by action of the electron beam.

In this case, as shown in FIGS. 1A, 1B, 2A and 2B, the electron beam is irradiated in the order to the plurality of exposure regions 201 formed in the pattern exposure mask 400 with the boundary region 202 being between each pair of adjacent exposure regions, and the irradiation regions of the electron beam passing through the respective exposure regions 201 are projected adjacent to one another on the surface of the silicon wafer 103, with no unexposed region corresponding to the boundary region 202. The circuit pattern which is divided into the plurality of exposure regions 201 separated from one another by the boundary region 202 in the pattern exposure mask 400, becomes one continuous exposure pattern on the surface of the silicon wafer 103.

In this process, the background exposure occurs because of the electron beams scattered by the beam scattering part 204 and the boundary region 202. As a result, the exposure strength of the circuit pattern by the transmission beam is intensified by the background exposure attributable to the scattering beam. In this embodiment of the electron beam projection apparatus in accordance with the present invention, however, since the beam restraining layer 401 formed at the boundary region 202 in the pattern exposure mask 400, the electron beam scattered by the boundary region 202 is restrained to the predetermined range.

Specifically, since the beam restraining layer 401 is constituted of the heavy metal film formed on a lower surface of the boundary region 202, the beam restraining layer 401 advantageously block the electron beam that was scattered by the boundary region 202 to be emitted in a downward direction. However, the beam restraining layer 401 retracts from the edge of the boundary region 202 by the predetermined distance 402, which is preferably the same as the width "a" of the gaps in the circuit pattern arranged at a minimum pitch.

Therefore, when the electron beam is irradiated in the order to a pair of adjacent exposure regions 201 in the pattern exposure mask 400, as shown in FIGS. 1A and 2A, the total exposure strength of a portion which is repeatedly exposed by the background exposure contributable to the electron beam scattered by the intervening boundary region 202 between the pair of adjacent exposure regions 201 irradiated in the order, becomes the same as the exposure strength of one background exposure contributable to the electron beam scattered by the beam scattering part 204, as shown in FIG. 2B.

In other words, in the electron beam projection apparatus in accordance with the present invention, the electron beam scattered by the intervening boundary region 202 is repeatedly irradiated on the same position in the silicon wafer 103, but since the electron beam scattered by the intervening boundary region 202 is restrained to the predetermined range, the strength of the total background exposure is equalized over the surface of the silicon wafer 103.

Accordingly, the line width of the circuit pattern projected by the transmission beam never increases partially, with the result that the circuit pattern is in no way short-circuited. Therefore, the semiconductor device fabricating system incorporating the electron beam projection apparatus in accordance with the present invention can fabricate a semiconductor integrated circuit having a uniform line width with no short-circuit problem.

In particular, in the pattern exposure mask 400 in accordance with the present invention, since the beam restraining layer 401 is constituted of the film formed on the lower surface of the boundary region 202, it is possible to restrain the electron beam that was scattered by the boundary region 202, to a desired strength level in a desired range.

Figure 4:
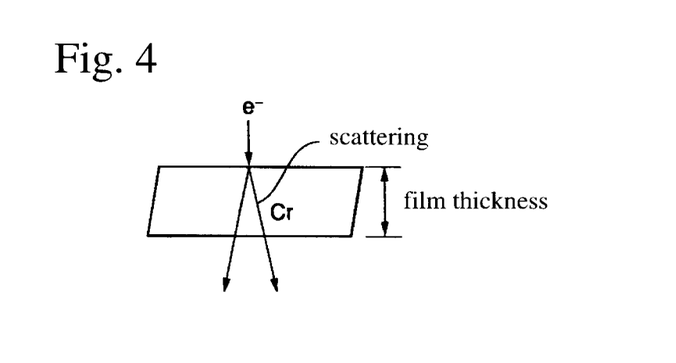
FIG. 4 illustrates the relation between a beam restraining layer and the electron beam.
Figure 5:
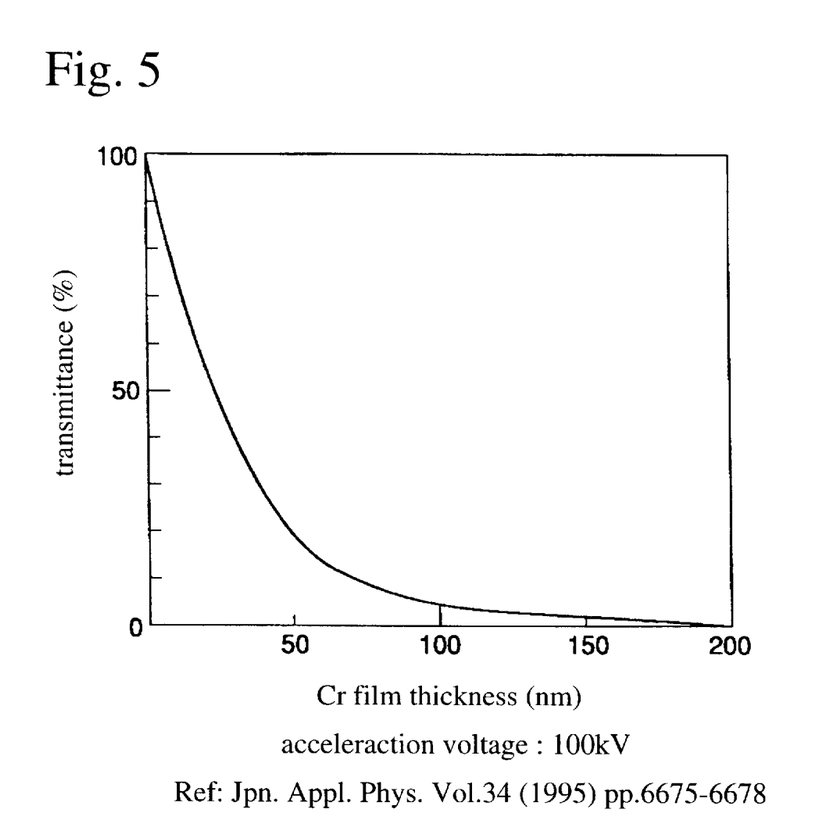
FIG. 5 is a graph illustrating the relation between the film thickness of the beam restraining layer and the transmittance of the electron beam.

Incidentally, as shown in FIG. 4, when the electron beam is irradiated onto the beam restraining layer 401 formed of the heavy metal, it is possible to control the transmittance of the electron beam by changing the film thickness of the beam restraining layer 401, as seen from the graph of FIG. 5. Thus, since the beam restraining layer 401 is formed of the heavy metal, the pattern exposure mask 400 in accordance with the present invention can advantageously restrain the electron beam scattered by the boundary region 202.

Now, a method for forming the pattern exposure mask 400 in accordance with the present invention will be described with reference to FIGS. 6A to 6D.

Figure 6A:
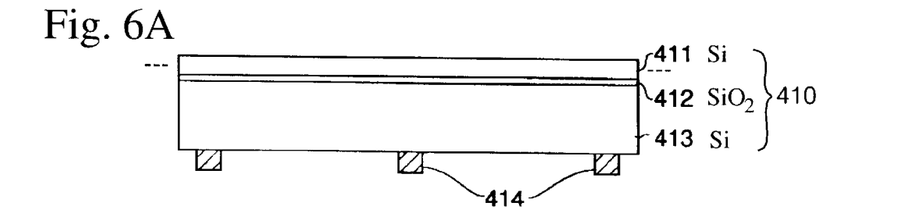
FIGS. 6A, 6B, 6C and 6D are diagrammatic sectional views for illustrating the process for forming the pattern exposure mask in accordance with the present invention.

First, as shown in FIG. 6A, an SOI substrate 410 is prepared which is a multilayer substrate composed of a first Si layer 411, a $SiO_2$ layer 412 and a second Si layer 413 which are stacked in the named order to have predetermined film thickness, respectively.

Figure 6B:
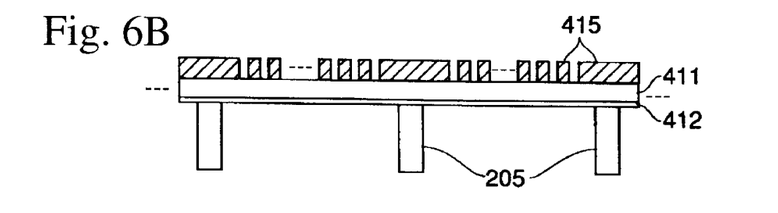

Then, a patterned resist film 414 is formed on one surface of the SOI substrate 410, and the second Si layer 413 is etched using the patterned resist film 414 as a mask, to form the support 205 as shown in FIG. 6B. Another patterned resist film 415 is formed on the other surface of the SOI substrate 410, and the first Si layer 411 is etched using the patterned resist film 415 as a mask, to form the boundary region 202 and the beam scattering parts 204, as shown in FIG. 6C.

Figure 6C:
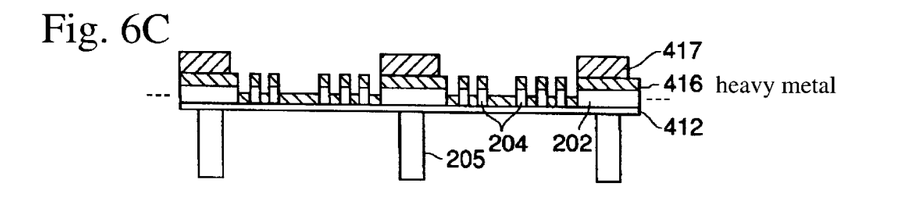
Figure 6D:
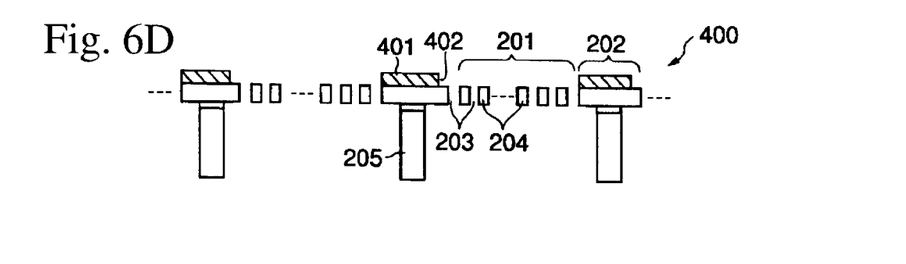

Thereafter, a heavy metal layer 416 is deposited on the boundary region 202 and the beam scattering parts 204, and a third patterned resist film 417 are formed to cover the heavy metal layer 416, as also shown in FIG. 6C. The heavy metal layer 416 is etched using the patterned resist film 417 as a mask to form the beam restraining layer 401, and then, the exposed $SiO_2$ layer 412 is selectively removed. Thus, the pattern exposure mask 400 is completed.

By the above mentioned method, it is possible to freely select the material, the film thickness, the shape and the position of the beam restraining layer 401, and therefore, it is possible to surely form the pattern exposure mask 400 capable of equalizing the background exposure.

The invention has thus been shown and described with reference to one embodiment. However, it should be noted that the present invention is in no way limited to the details of the illustrated structures but changes and modifications may be made within the scope of the appended claims.

For example, in the above mentioned embodiment, the electron beam is used as the charged particle beam for the exposure of the circuit pattern. However, an ion beam can be used for the exposure of the circuit pattern.

In the above mentioned embodiment, there is provided the beam restraining layer 401 formed of the heavy metal for advantageously blocking the electron beam, thereby to restraining the electron beam scattered by the boundary region 202 to the predetermined range. However, the electron beam can be restrained by extremely scattering the electron beam.

In the above mentioned embodiment, the pattern exposure mask 400 has a number of exposure regions 201 arranged in the form of a matrix having a plurality of rows and a plurality of columns and has the beam transmission parts formed of the through hole, similarly to the prior art pattern exposure mask 200. However, the present invention can be applied to a pattern exposure mask which has a number of vertically extending elongated exposure regions 301 arranged in a horizontal direction and separated from one another by an elongated boundary region 302, and which has the boundary region 302 and a beam scattering part 303 formed of a heavy metal layer, similarly to the prior art pattern exposure mask 300.

Figure 7:
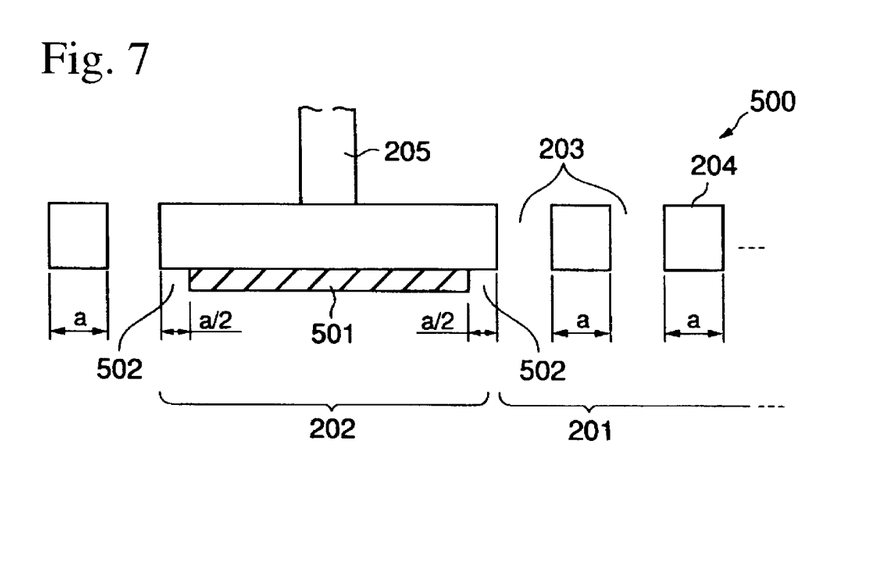
FIG. 7 is a diagrammatic partial sectional view showing an essential part of one modification of the pattern exposure mask in accordance with the present invention.

In the above mentioned embodiment, in only one of opposite sides of the boundary region 202 facing to adjacent exposure regions 201, respectively, the beam restraining layer 401 retracts from the edge of the boundary region 202 by a predetermined distance "a". However, as in a pattern exposure mask 500 shown in FIG. 7, in opposite sides of the boundary region 202 facing to adjacent exposure regions 201, respectively, the beam restraining layer 401 retracts from the edge of the boundary region 202 by a predetermined distance 502 corresponding to a half "a/2" of the width "a" of the gaps in the circuit pattern arranged at a minimum pitch.

In the above mentioned embodiment, the beam restraining layer 401 is additionally formed on the lower surface of the boundary region 202. However, the beam restraining layer 401 can be additionally formed on an upper surface of the boundary region 202, or in the inside of the boundary region 202. In addition, the beam restraining layer 401 can be formed of a material other than the heavy metal.

Figure 8:
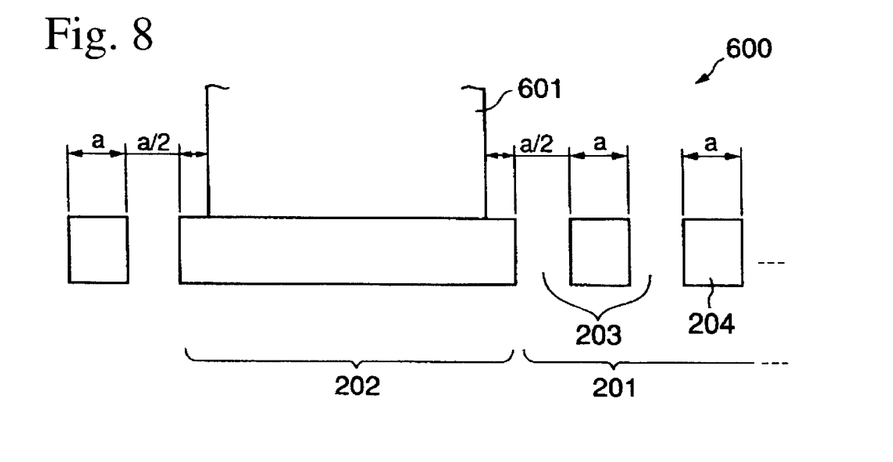
FIG. 8 is a diagrammatic partial sectional view showing an essential part of another modification of the pattern exposure mask in accordance with the present invention.

For example, when the pattern exposure mask 400 is formed from the SOI substrate 410, since it is possible to leave the reinforcing support 205 on the upper surface of the boundary region 202, it is possible to form a beam restraining means by a support 601 having a predetermined shape, as in a pattern exposure mask 600 shown in FIG. 8. The support 601 retracts from the edge of the boundary region 202 by the predetermined distance "a/2" at opposite sides of the boundary region 202.

In the pattern exposure mask 400 mentioned above, since the independent beam restraining layer 401 is additionally formed, it is possible to form the beam restraining layer 401 having a desired physical property. On the other hand, in the pattern exposure mask 600, the physical property of the support 601 may not be optimum, however, it is possible to realize the beam restraining means without additionally forming the independent film.

The following advantages can be obtained according to the present invention.

(1) In the pattern exposure apparatus in accordance with the present invention, the charged particle beam scattered by the boundary region is repeatedly irradiated on the same position in the circuit member.

However, since the beam restraining means restrains the charged particle beam scattered by the boundary region to the predetermined range, the strength of the total background exposure is substantially equalized over the surface of the circuit member.

(2) In the pattern exposure apparatus in accordance with the present invention, when the charged particle beam is irradiated in the order to a pair of adjacent exposure regions in the pattern exposure mask, the total exposure strength of a portion on the circuit member which is repeatedly exposed by the background exposure contributable to the charged particle beam scattered by the intervening boundary region between the pair of adjacent exposure regions irradiated in the order, becomes the same as the exposure strength of one background exposure contributable to the charged particle beam scattered by the beam scattering part. Therefore, the strength of the total background exposure is substantially equalized over the surface of the circuit member, and it is possible to prevent the line width of the projected circuit pattern from increasing partially.

(3) When the beam restraining means is formed of the independent film formed on at least one of the lower surface and the upper surface of the boundary region in the pattern exposure mask, it is possible to restrain the charged particle beam scattered by the boundary region, to a desired strength level in a desired range.

(4) When the beam restraining means is formed of the independent heavy metal film formed on at least one of the lower surface and the upper surface of the boundary region in the pattern exposure mask, it is possible to advantageously block the charged particle beam, thereby to effectively restrain the charged particle beam.

(5) When pattern exposure mask is formed from a multilayer substrate to leave a support on the boundary region, if the support is patterned to function as the beam restraining means, the beam restraining means can be realized without additionally providing the independent film.

(6) In the semiconductor device fabricating method using the semiconductor device fabricating system in accordance with the present invention, a semiconductor device is fabricated by repeating the process in which the resist film is deposited on the circuit member and then is patterned by the exposure using the pattern exposure apparatus in accordance with the present invention to pattern the resist film. Therefore, since the semiconductor device can be fabricated by substantially equalizing the strength distribution of the background exposure, and therefore, the semiconductor device can be fabricated at a good yield of production with an equalized circuit line width and with no short-circuiting.

(7) in the semiconductor device in accordance with the present invention, since the circuit pattern is exposed by the pattern exposure apparatus in accordance with the present invention, the background exposure is substantially equalized, with the result that the circuit line width is substantially equalized, and a short-circuiting is prevented.

What is claimed is:

1. A pattern exposure method using a pattern exposure system which comprises a pattern exposure mask including a plurality of exposure regions which are separated from one another by a boundary region and which correspond to a plurality of circuit sub-patterns obtained by dividing one circuit pattern, each of said exposure regions including a plurality of beam transmission parts and a plurality of beam scattering parts, and a beam irradiating means for irradiating a charged particle beam to said pattern exposure mask, the method including the step of irradiating with said charged particle beam from said beam irradiating means each of said plurality of exposure regions in said pattern exposure mask one at a time so as to cause the transmitted charged particle beam passing through said beam transmission parts of said exposure region in said pattern exposure mask to expose a circuit member therein one at a time, said irradiation areas of the charged particle beam passing through the respective exposure regions in said pattern exposure mask being arranged adjacent to one another on a surface of said circuit member with no intervening portion corresponding to said boundary region, and permitting a background exposure attributable to the charged particle beam scattered by said beam scattering parts and said boundary region, the charged particle beam scattered by said boundary region in said pattern exposure mask being restrained to a predetermined range by a beam restraining means, said beam restraining means retracted from an edge of said boundary region by a predetermined distance.

2. The pattern exposure method according to claim 1 wherein said predetermined distance equals a minimum width of at least one of said plurality of beam scattering parts.

3. A pattern exposure system comprising a pattern exposure mask including a plurality of exposure regions separated from one another by a boundary region, said plurality of exposure regions corresponding to a plurality of circuit sub-patterns obtained by dividing one circuit pattern, each of said exposure regions including a plurality of beam transmission parts and a plurality of beam scattering parts, and a beam irradiating means for irradiating with a charged particle beam said pattern exposure mask, the pattern exposure system being so configured to irradiate with said charged particle beam from said beam irradiating means each of said plurality of exposure regions in said pattern exposure mask one at a time, so as to cause the transmitted charged particle beam passing through said beam transmission parts of said exposure region in said pattern exposure mask to expose a circuit member therein, said irradiation areas of the charged particle beam passing through the respective exposure regions in said pattern exposure mask being arranged adjacent to one another on a surface of said circuit member with no intervening portion corresponding to said boundary region, and permitting a background exposure attributable to a charged particle beam scattered by said beam scattering parts and said boundary region, the pattern exposure system also comprising a charged particle beam restraining means for limiting the charged particle beam scattered by said boundary region in said pattern exposure mask to a predetermined range, said beam restraining means retracted from an edge of said boundary region by a predetermined distance, said charged particle beam restraining means being provided on said pattern exposure mask so that when said charged particle beam is irradiated one at a time onto a pair of adjacent exposure regions in said pattern exposure mask, exposure strength of a portion said circuit member repeatedly exposed by background exposure attributable to the charged particle beam scattered by an intervening boundary region between the pair of adjacent exposure regions irradiated one at a time becomes the same as exposure strength of one background exposure attributable to the charged particle beam scattered by the beam scattering part, said charged particle beam restraining means being provided on said pattern exposure mask so that when said charged particle beam is irradiated one at a time onto a pair of adjacent exposure regions in said pattern exposure mask, and a portion of said circuit member repeatedly exposed to a background exposure strength distribution attributable to the charged particle beam scattered by an intervening boundary region between the pair of adjacent exposure regions irradiated one at a time becomes equal to a background exposure strength distribution attributable to the charged particle beam scattered by the beam scattering part.

4. A pattern exposure system claimed in claim 3 wherein said charged particle beam restraining means is constituted of a film formed on at least one of an upper surface and a lower surface of said boundary region in said pattern exposure mask.

5. A pattern exposure system claimed in claim 4 wherein said film is formed of a heavy metal selected from the group consisting of (a) tungsten (W), (b) tantalum (Ta), (c) molybdenum (Mo), (d) titanium (Ti), (e) cobalt (Co), (f) platinum (Pt), (g) silver (Ag), and (h) gold.

6. A pattern exposure system claimed in claim 3 wherein said charged particle beam restraining means is constituted of a support remaining on said boundary region in said pattern exposure mask.

7. A pattern exposure system claimed in claim 4 wherein said film is formed of a heavy metal compound selected from the group consisting of (a) titanium nitride and (b) tungsten silicide.

8. A pattern exposure mask including a plurality of exposure regions separated from one another by a boundary region, said plurality of exposure regions corresponding to a plurality of circuit sub-patterns obtained by dividing one circuit pattern, each of said exposure regions including a plurality of beam transmission parts and a plurality of beam scattering parts, the pattern exposure mask including a charged particle beam restraining means for restraining the charged particle beam scattered by said boundary region in said pattern exposure mask to a predetermined range, said beam restraining means retracted from an edge of said boundary region by a predetermined distance, said charged particle beam restraining means being provided on said pattern exposure mask so that when said charged particle beam is irradiated one at a time onto a pair of adjacent exposure regions in said pattern exposure mask, and a portion of said circuit member repeatedly exposed to a background exposure strength distribution attributable to the charged particle beam scattered by an intervening boundary region between the pair of adjacent exposure regions irradiated one at a time becomes equal to a background exposure strength distribution attributable to the charged particle beam scattered by the beam scattering part.

9. A pattern exposure mask claimed in claim 8 wherein said charged particle beam restraining means is constituted of a film formed on at least one of an upper surface and a lower surface of said boundary region in said pattern exposure mask.

10. A pattern exposure mask claimed in claim 9 wherein said film is formed of a heavy metal selected from the group consisting of (a) tungsten (W), (b) tantalum (Ta), (c) molybdenum (Mo), (d) titanium (Ti), (e) cobalt (Co), (f) platinum (Pt), (g) silver (Ag), and (h) gold (Au).

11. A pattern exposure mask claimed in claim 8 wherein said charged particle beam restraining means is constituted of a support remaining on said boundary region in said pattern exposure mask.

12. A pattern exposure system claimed in claim 9 wherein said film is formed of a heavy metal compound selected from the group consisting of (a) titanium nitride and (b) tungsten silicide.

* * * * *